United States Patent
Wen et al.

[11] Patent Number: 5,918,121
[45] Date of Patent: Jun. 29, 1999

[54] METHOD OF REDUCING SUBSTRATE LOSSES IN INDUCTOR

[75] Inventors: Wen-Ying Wen; Chih-Ming Chen, both of Hsinchu, Taiwan

[73] Assignee: Winbond Electronics Corp., Hsinchu, Taiwan

[21] Appl. No.: 09/113,019

[22] Filed: Jul. 9, 1998

[51] Int. Cl.⁶ .............................. H01L 29/72; H01L 21/76
[52] U.S. Cl. .................... 438/243; 257/501; 257/531; 336/200; 336/232; 438/243; 438/359
[58] Field of Search ...................... 257/501, 531, 257/571; 336/200, 232; 438/243, 359

[56] References Cited

U.S. PATENT DOCUMENTS

| | | | |
|---|---|---|---|
| 5,283,462 | 2/1994 | Stengel | 257/595 |
| 5,767,563 | 6/1998 | Imam et al. | 257/531 |
| 5,805,043 | 9/1998 | Bahl | 336/200 |
| 5,844,299 | 12/1998 | Merrill et al. | 257/531 |

*Primary Examiner*—Donald L. Monin, Jr.
*Assistant Examiner*—Dwayne L. Bentley
*Attorney, Agent, or Firm*—W. Wayne Liauh

[57] ABSTRACT

A method for making planar silicon-based inductor structure with improved Q is disclosed. This method includes the steps of: (a) providing a lightly-doped P-type substrate as a starting wafer; (b) forming a preliminary oxide layer on the lightly-doped P-type substrate; (c) forming a first oxide layer from the preliminary oxide layer enclosing a predetermined epitaxial area; (d) depositing an epitaxial layer in the epitaxial area using intrinsic doping; (e) forming a second oxide layer which covers both the epitaxial layer and the first oxide layer, and is merged with the first oxide layer to thus form a contiguous inter-connected inductor oxide layer; (f) forming a metal line according to a planar inductor pattern so as to form a silicon-based inductor structure. The epitaxial layer has a resistivity of at least 2 K ohm-cm. The planar silicon-based inductor improves the Q value by reducing or stopping current losses into the substrate.

20 Claims, 4 Drawing Sheets

METHOD OF REDUCING SUBSTRATE LOSSES IN INDUCTOR

FIELD OF THE INVENTION

The present invention relates to improved integrated circuit, or semiconductor, inductors. More specifically, the present invention relates to an improved inductor for use in integrated circuitry which allows reduced cell size and improved quality factor Q to be achieved without incurring substantially increased manufacturing cost. The high-quality factor inductors of the present invention are most advantageous for use in silicon-based wireless and other radio frequency (RF) integrated circuits (IC) applications.

BACKGROUND OF THE INVENTION

An inductor is an electronic component designed especially to provide a controlled amount of inductance, which is a quantitative measure of the ability of a device to store energy in the form of a magnetic field. Inductance is conventionally represented by the capital letter L, and the unit of inductance is henry. One henry is the amount of inductance to generate 1 volt of voltage with a current that changes at the rate of 1 ampere per second. Conventionally, the inductors generally consist of a length of wire wound into a solenoidal or toroidal shape. An inductor is a key element in a wide variety of radio frequency (RF) circuits, such as those used in cellular telephones, wireless modems, and other types of communication equipment.

With the fervent drive for continuous miniaturization of electronic circuits especially with regard to consumer goods, many digital and analog circuits have been successfully implemented into silicon or semiconductor based integrated circuits (ICs). And the trend is increasing at an even faster rate. The goal to achieve miniaturization involves not only the task to achieve compactness in terms of mechanical packaging, but also the task to decrease the cost of manufacturing. One area that remains a challenge to the goal of miniaturization is the manufacturing of radio frequency (RF) circuits.

Silicon technologies have been applied to provide integratable inductive structures. However, one of the problems in applying silicon technologies to RF applications is the relatively low quality factor, or the so-called Q values, of the inductors fabricated from silicon technology. The quality factor Q is related to the inductance L and resistance R of the inductor according to the following equation ($\omega_0$ is $2\pi$ times the frequency):

$$Q = \omega_0 * L/R$$

Planar inductors with a spiral structure are the most common type of inductors within integrated circuits. FIG. 7 shows an example of such spiral structured silicon-based inductor. The overall inductance L of the conductive path of the silicon based inductor is calculated by summing the inductance of each sub-length of each individual segment. During operation, fields are created by current flowing through the spiral pattern which tend to cause the current to flow along the inner or shorter edges, i.e., the paths of least resistance. Such a current flow can cause a significant increase in resistance with increasing frequency. With the need for further miniaturization, there is a need to pack more segments into a smaller area, and the current flow between segments becomes even more significant.

U.S. Pat. No. 5,227,659, the content thereof is incorporated by reference, discloses a method by which standard CMOS technology is used to fabricate a multiturn coil having its axis normal to the layers of oxide. For a coil 100 microns on a side, an inductance on the order of 10 nH can be achieved. This value can be increased to as high as 0.1 mH by including a magnetic core in the design.

U.S. Pat. No. 5,446,311, the content thereof is incorporated by reference, discloses a method for forming a monolithic high-Q inductor structure having multiple metalization levels using a conventional integrated circuit technology. In this monolithic high-Q inductor structure, inductor turns utilize these multiple levels to reduce the inductor resistance. The inventors of the '311 patent claimed that inductors with Q values above five can be integrated with this approach at radio and microwave frequencies.

U.S. Pat. No. 5,545,916, the content thereof is incorporated by reference, discloses a high-frequency inductive structure integratable with a semiconductor integrated circuit. In this invention, a conductive path forming the structure is arranged so extra conductive material is located at portions of the cross-section of the conductive path where current tends to flow at high frequency. In the '916 invention, the location at which the extra conductive material is disposed is critical.

U.S. Pat. No. 5,635,892, the content thereof is incorporated by reference, discloses a high-Q inductive structure with increased self-inductance and improved Q at high frequencies. The inductive structure disclosed in the '892 patent contains (1) an electrical conductor providing a conductive path formed as a spiral planar pattern upon a substrate, and (2) a core of magnetic material in proximity to and facing the planar pattern which defines an opening in the central region of the planar pattern.

While the above-mentioned inventions have their merits, they all involve relatively complicated fabrication procedure. Moreover, with the significant market potential of silicon-based inductors, it is highly desirable to devote research and development efforts so that improved high-Q inductive structures can be discovered and implemented into the currently existing integrated circuitry with minimum device size.

SUMMARY OF THE INVENTION

The primary object of the present invention is to develop a method for making improved silicon-based inductors with reduced cell size and increased quality factor Q, and the improved silicon-based inductors made therefrom. More specifically, the primary object of the present invention is to develop an improved silicon-based inductor which involves a novel design that reduces the induction loss by reducing electricity loss through the substrate. The improved silicon-based inductor of the present invention allows Q factor to be increased without increasing the cell size and without incurring substantially increased manufacturing cost. The high-quality factor inductors of the present invention are most advantageous for use in silicon-based wireless and other RF IC applications.

FIG. 1 is an illustrative schematic diagram showing a partial cross-section of a prior art inductor integrated on a silicon substrate. FIG. 1 is prepared so that it only shows the interactions between two metal segments. FIG. 2 shows a lumped equivalent circuit for the silicon-based inductor as shown in FIG. 1. In FIG. 2, $C_f$ represents the fringing capacitance between the metal lines, L and R represent the lumped series inductance and resistance, respectively, $R_1$ and $R_2$ represent the resistance associated with substrate losses (i.e., the loss of induction current into the semiconductor substrate) from coil sections 1 and 2, respectively, and $C_1$ and $C_2$ also respectively represent the lumped capacitance associated with the substrate losses.

As discussed above, the quality factor Q is related to the inductance L and resistance R of the inductor according to the following equation ($\omega_0$ is $2\pi$ times frequency):

$$Q=\omega_0*L/R$$

During the miniaturization of inductors, resistances associated with current loss to the substrate $R_1$ and $R_2$ become decreased. As a result, substrate losses become increased. Thus, a considerable amount of energy propagates into the substrate and become dissipated. All the prior art silicon-based inductors have failed to take into consideration the substrate losses and how they may impact the overall inductor loss.

In the present invention, the fabrication process for the silicon-based inductors is modified so that the induction current resistivity from the coil to the substrate (i.e., $R_1$ and $R_2$ as shown in FIG. 2) is increased, and consequently substrate losses are minimized, while maintaining the cells at the same dimension. The modification made in the present invention allows the overall inductor loss to be reduced, so as to improve the Q value. One of the main advantages of the present invention is that the modification can be easily implemented using existing technology and without incurring significant increase in the manufacturing cost, while very beneficial results, in terms of improving the Q value of silicon-based inductors, are obtained.

The process disclosed in the present invention can be summarized as comprising the following main steps:

(1) Obtaining a lightly-doped substrate as a starting wafer.

(2) Forming an oxide layer on the lightly-doped substrate by oxidization or chemical vapor deposition (CVD).

(3) Defining a planar inductor pattern on the lightly-doped substrate;

(4) Defining an epitaxial area on the lightly-doped substrate which embraces the planar inductor pattern;

(5) Forming a first oxide layer enclosing and outside of the an epitaxial area using a photolithography technology and anisotropic plasma etching in conjunction with a photoresist;

(6) Depositing an epitaxial layer in the epitaxial area;

(7) Forming a second oxide layer covering both the epitaxial layer and the first oxide layer using chemical vapor deposition followed by chemical-mechanical planarization (CMP), the second oxide layer merges with the first oxide layer to form an inductor oxide layer;

(8) Form a metal line or metal pattern according to the designed planar inductor pattern to form a silicon-based inductor as disclosed in the present invention.

Typically, the planar inductor pattern is a spiral inductor pattern. However, it can be any other pattern. One of the key elements of the present invention is to form the epitaxial layer underneath the planar inductor pattern (but separated by the inductor oxide layer) so as to minimize or stop the entering of induction current into the substrate and thus reduces or eliminates the undesirable substrate losses. The epitaxial layer should have a relatively high resistivity (preferably above 2 K ohm-cm). As discussed before, reducing substrate losses will reduce the overall inductor losses and improve the quality factor, Q, of the silicon-based inductor.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

The present invention discloses a method for making improved silicon-based inductors with reduced cell size and increased quality factor Q, and the improved silicon-based inductors made therefrom. The high-quality factor inductors of the present invention are most advantageous for use in silicon-based wireless and other RF IC applications.

Figure 1:
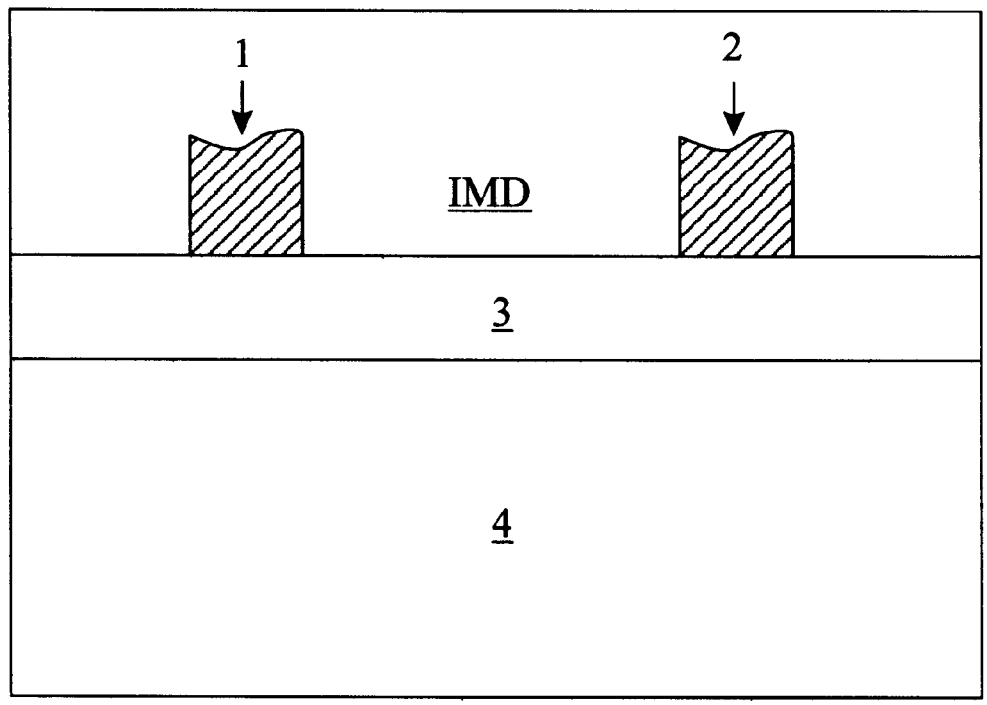
FIG. 1 is an illustrative schematic diagram showing a partial (inter-metal) cross-section of a prior art inductor integrated on a silicon substrate.
Figure 2:
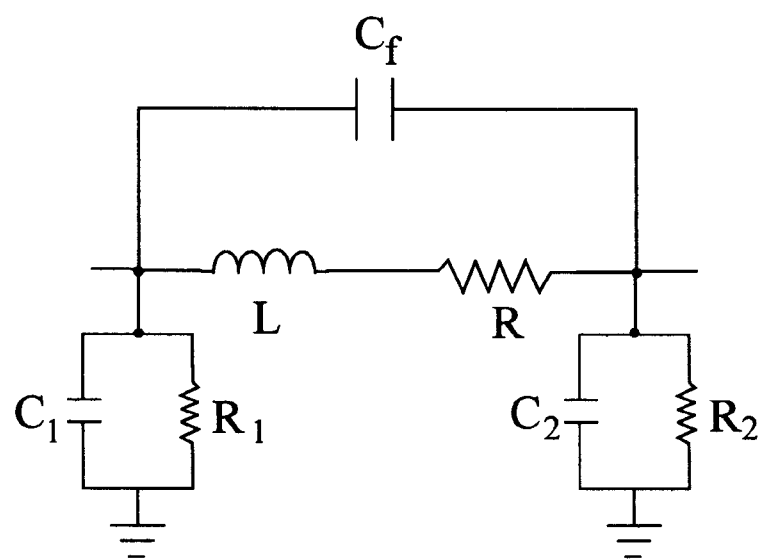
FIG. 2 is a schematic circuit diagram showing a lumped equivalent circuit for the silicon-based inductor as shown in FIG. 1.
Figure 7:
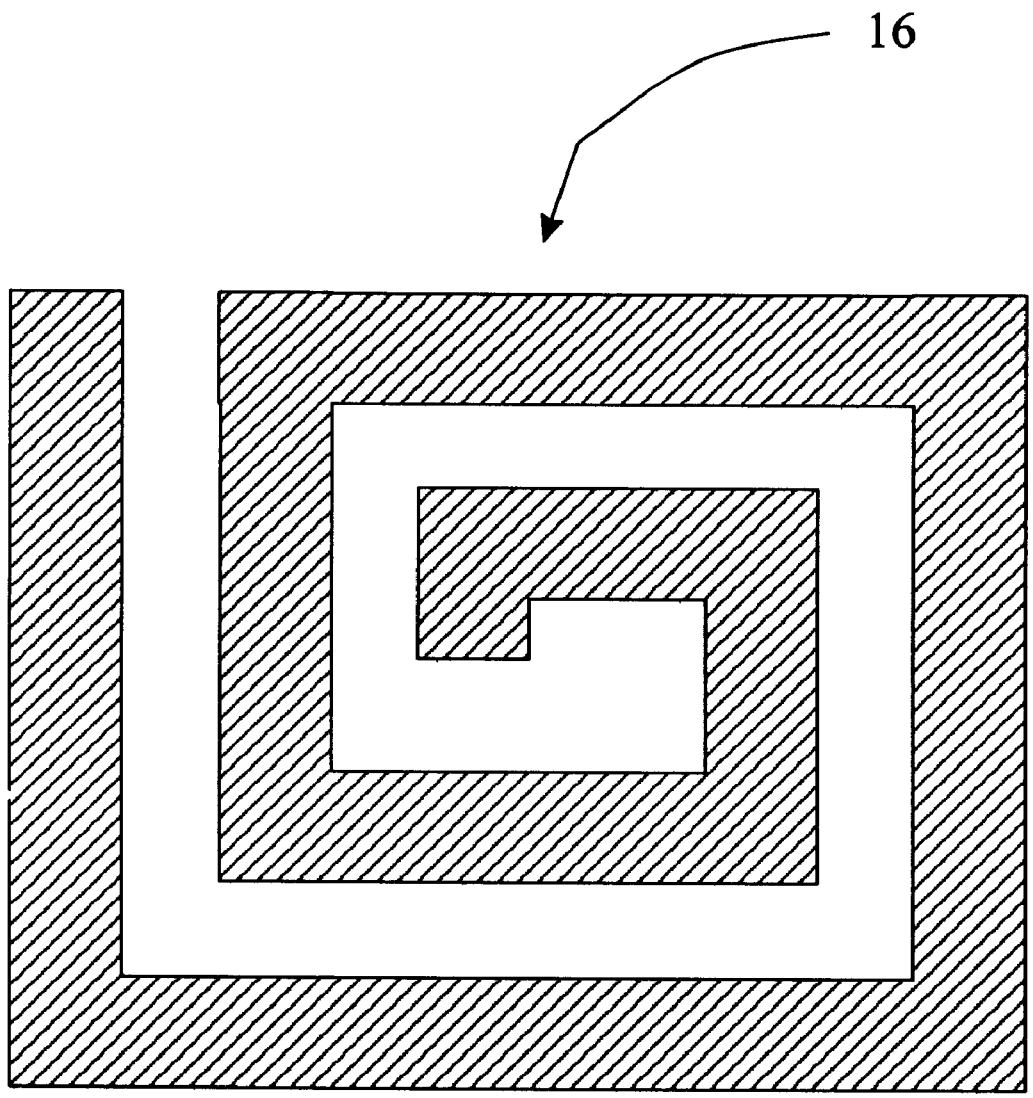
FIG. 7 shows a top view of an example of a planar spirally-structured silicon-based inductor.

FIG. 1 is an illustrative schematic diagram showing a partial cross-section (showing only the inter-metal region which is of primary interest) of a conventional inductor integrated on a silicon substrate. In FIG. 1, it is shown a planar inductor structure represented by two cross-sections 1 and 2. The planar inductor structure typically is a planar spirally-structured silicon-based inductor as shown FIG. 7. The planar inductor structure 1 and 2 are formed on an oxide layer 3, which, in turn, is formed on a substrate 4. FIG. 2 shows a lumped equivalent circuit for the silicon-based inductor as shown in FIG. 1. In FIG. 2, $C_f$ represents the fringing capacitance between the metal lines, L and R represent the lumped series inductance and resistance, respectively, $R_1$ and $R_2$ represent the resistance s associated with substrate losses, and $C_1$ and $C_2$ represent the lumped capacitances associated with the substrate losses, of induction currents from inductor sections 1 and 2, respectively. As discussed above, the quality factor Q is related to the inductance L and resistance R of the inductor according to the following equation ($\omega_0$ is $2\pi$ times frequency):

$$Q=\omega_0*L/R$$

During the miniaturization of inductors, resistence s associated with current loss to the substrate $R_1$ and $R_2$ become decreased. As a result, substrate losses become increased, and a considerable amount of energy dissipates into the substrate and is wasted.

In the present invention, an epitaxial layer is formed underneath the planar inductor structure on a semiconductor substrate. The epitaxial layer is epitaxial layer with a relatively high resistivity. The epitaxial layer and the planar inductor structure are segregated by an oxide layer, which also surrounds the epitaxial layer. The novel design of the present invention reduces or eliminates induction current loss to the substrate. As a result, it allows the overall inductor loss to be reduced, so as to improve the Q value. One of the main advantages of the present invention is that the modification can be easily implemented using existing technology without incurring significant increase in the manufacturing cost, while very beneficial results, in terms of improving the Q value of silicon-based inductors, are obtained.

Figure 3:
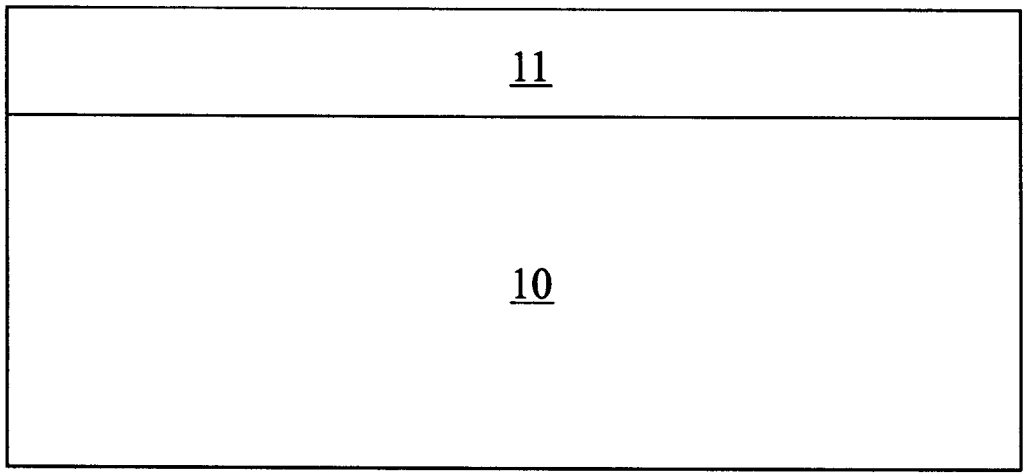
FIG. 3 is an illustrative schematic diagram showing that an oxide layer is deposited on a semiconductor substrate according to a preferred embodiment of the present invention.

FIG. 3 is an illustrative schematic diagram according to a preferred embodiment of the present invention showing that an oxide layer 11 is deposited on a substrate 10. In the preferred embodiment, the substrate is a lightly-doped p-type substrate with a resistivity of about 10 ohm-cm. The substrate is oxidized or deposited, using chemical vapor deposition, to form an oxide layer having a thickness of about 2 μm.

Figure 4:
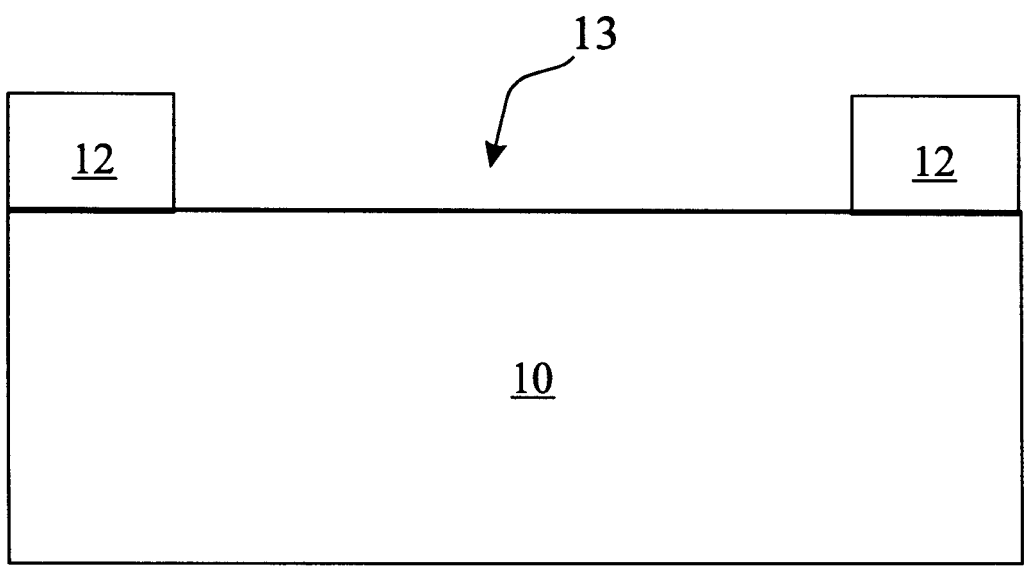
FIG. 4 is an illustrative schematic diagram showing that the oxide layer is subject to photolithography and anisotropic etching to form the first oxide layer enclosing the area wherein a planar inductor is to be subsequently formed.

FIG. 4 shows that the oxide layer 11 of FIG. 3 is subject to photolithography and anisotropic etching to form a first oxide layer 12 enclosing the area wherein a planar inductor, not shown, is to be subsequently formed. In this step, a photoresist layer, not shown, is first formed covering the entire substrate. Then the portion of photoresist covering an area slightly larger than that intended for the planar inductor is removed. Thereafter, anisotropic plasma etching is conducted to remove oxide from the portion of the first oxide layer not covered by photoresist (which is called the "epitaxial area" 13 ). Finally the photoresist is removed and the final result is shown in FIG. 4.

Figure 5:
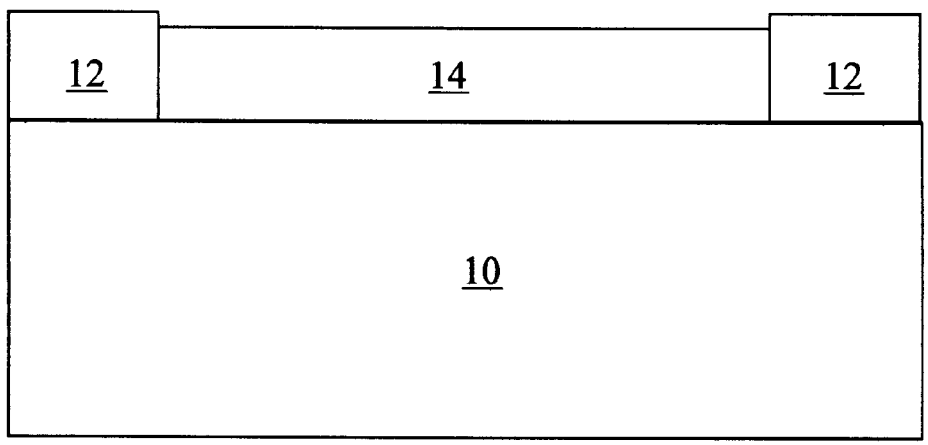
FIG. 5 is an illustrative schematic diagram showing that an epitaxial layer is formed which is enclosed by the first oxide layer.

In the next step, a short clean step is conducted in-situ to remove any surface defects and native oxide. Then a thin, about 2 μm in thickness, epitaxial layer 14 is deposited inside the epitaxial area as shown in FIG. 5. Since the oxide layer 12 is an insulator, it is invisible to the induction current generated from the inductor pattern. The placement of the epitaxial layer as disclosed in the present invention causes a high-resistivity, but not insulating, element to be connected in series between the inductor pattern and the substrate. In other words, the resistivity associated with substrate loss $R_1$ or $R_2$, which are typically in the order of 10–20 ohm-cm, will be substantially enhanced by the resistivity of the epitaxial layer. Preferably, the epitaxial layer 14 should have a resistivity in the order of thousands of ohm-cm. More preferably, the resistivity of the epitaxial layer is 2 K ohm-cm or greater, but it should not be an insulator. The epitaxial layer 14 can be intrinsically doped to achieve the optimum resistivity. FIG. 5 shows that the epitaxial layer 14 is enclosed by the first oxide layer 12. The epitaxial layer can comprise epitaxial silicon lightly doped with N-type materials such as arsenic, phosphorous, etc.

Figure 6:
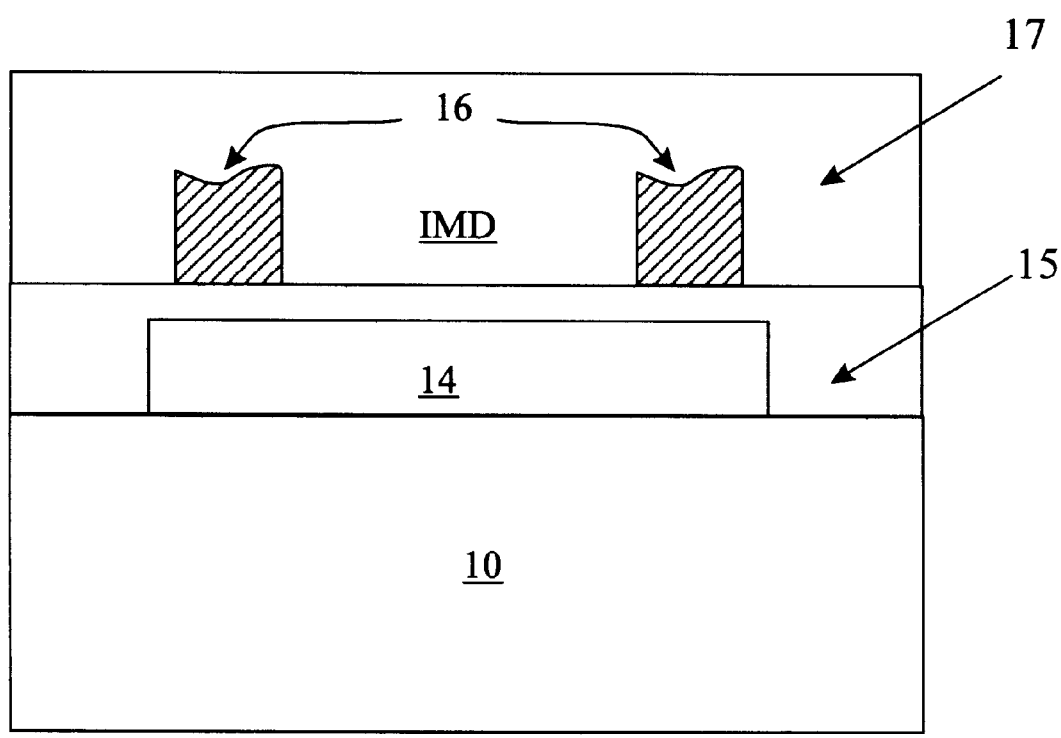
FIG. 6 is an illustrative schematic diagram showing a preferred embodiment of the improved silicon-based inductor of the present invention in which a second oxide layer is formed covering the epitaxial layer which is merged with the first oxide layer to form the inductor oxide layer and then a metal line is formed on top of the inductor oxide layer to for the planar inductor.

Finally, a second oxide layer is formed covering both the epitaxial layer and the first oxide layer. The second oxide layer merges with the first oxide layer to form the inductor oxide layer and then a metal pattern is formed on top of the inductor oxide layer to form the planar inductor structure. FIG. 6 is an illustrative schematic diagram showing a preferred embodiment of the improved silicon-based inductor of the present invention in which an epitaxial layer 14 sits on top of the substrate 10. An inductor oxide layer 15 is provided which separates the epitaxial layer 14 from the planar inductor structure 16 and which also encloses the epitaxial layer 14. FIG. 6 also shows that an inter-metal dielectric (IMD) layer 17 is provided covering the planar inductor structure 16.

The planar inductor pattern 16 as shown in FIG. 6 can be a spiral inductor pattern. However, it can be any other pattern. One of the advantages of the present invention is that, due to the existence of the epitaxial layer, which is formed underneath the planar inductor pattern but is separated by the inductor oxide layer, the extent to which the induction current will be lost into the substrate is greatly reduced or even effectively eliminated, and thus the undesirable substrate losses are greatly reduced or eliminated. As a result, the present was able to reduce the overall inductor losses and improve the quality factor, Q, of the silicon-based inductor.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

A lightly-doped p-type substrate was used as the starting wafer. The wafer was deposited using chemical vapor deposition, to form an oxide layer having a thickness of about 2 μm. As discussed earlier, the oxide layer could also be formed using an oxidation procedure. A photoresist layer was formed which capped the entire substrate. Then the portion of the photoresist covering an area slightly larger than that intended for the planar inductor was removed. Thereafter, an anisotropic plasma etching step was conducted to remove oxide from the portion of the first oxide layer not covered by photoresist. The portion of the area not covered by the photoresist is called the "epitaxial area" 13). Finally the photoresist was removed and the portion of the substrate corresponding to the epitaxial area was exposed.

In the next step, a short clean step was conducted in-situ to remove any surface defects and native oxide. Then a thin layer, about 2 μm in thickness, of phosphorus-doped epitaxial silicon was deposited inside the epitaxial area. The phosphorus-doped epitaxial silicon layer had a resistivity of about 2 K ohm-cm. Other N-type materials, such as arsenic, can also be used in forming the in-situ doped epitaxial layer. The epitaxial layer was enclosed by the first oxide layer but its height was below the height of the first oxide layer.

A second oxide layer was formed covering both the epitaxial layer and the first oxide layer. The height difference between epitaxial layer and the first oxide layer allowed the second oxide layer to merge with the first oxide layer to form the inductor oxide layer and then a metal pattern is formed on top of the inductor oxide layer to form the planar inductor structure. The planar inductor pattern had a spirally-shaped inductor pattern. However, it can be any other pattern. Finally, the planar inductor structure was covered by an inter-metal dielectric (IMD) layer to complete the fabrication process.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for making planar silicon-based inductor structure comprising the steps of:

(a) providing a silicon-based substrate as a starting wafer;

(b) forming a preliminary oxide layer on said substrate;

(c) forming a first oxide layer from said preliminary oxide layer, wherein said first oxide layer is formed outside of and enclosing a predetermined epitaxial area;

(d) depositing an epitaxial layer in said epitaxial area, wherein said epitaxial layer comprises epitaxial silicon;

(e) forming a second oxide layer covering both said epitaxial layer and said first oxide layer, wherein said second oxide layer is merged with said first oxide layer to thus form a contiguous inter-connected inductor oxide layer comprising said first oxide layer and said second oxide layer;

(f) forming a metal line according to a predetermined planar inductor pattern so as to form a silicon based inductor structure on said substrate.

2. The method for making planar silicon-based inductor structure according to claim 1 wherein said preliminary oxide layer is formed on said substrate by oxidization or chemical vapor deposition during step (b) of claim 1.

3. The method for making planar silicon-based inductor structure according to claim 1 wherein said preliminary oxide layer formed during step (b) of claim 1 has a thickness of about 2 µm.

4. The method for making planar silicon-based inductor structure according to claim 1 wherein said planar inductor pattern is a spirally shaped pattern.

5. The method for making planar silicon-based inductor structure according to claim 1 wherein said first oxide layer is formed from said preliminary oxide layer using a process comprising the following steps:

(a) forming a photoresist layer to cover said substrate;

(b) using a photographic technique to remove a portion of said photoresist corresponding to said epitaxial area;

(c) using an anisotropic etching technique to remove a portion of said preliminary oxide layer, which is formed during step (b) of claim 1, not covered by said photoresist; and (d) removing the remaining photoresist.

6. The method for making planar silicon-based inductor structure according to claim 1 wherein said epitaxial layer contains phosphorus- or arsenic-doped epitaxial silicon.

7. The method for making planar silicon-based inductor structure according to claim 1 wherein said epitaxial layer has a resistivity of at least about 2,000 ohm-cm.

8. The method for making planar silicon-based inductor structure according to claim 1 wherein said epitaxial layer is formed by depositing an epitaxial layer of N-type in said epitaxial area using intrinsic doping.

9. The method for making planar silicon-based inductor structure according to claim 1 wherein said first oxide layer has a height greater than the height of said epitaxial layer so as to allow said second oxide layer to merge with said first oxide layer both vertically and horizontally.

10. The method for making planar silicon-based inductor structure according to claim 1 which further comprises the step of depositing an inter-metal dielectric layer to cover said metal line which constitutes a planar inductor structure.

11. A planar silicon-based inductor comprising:

(a) a silicon-based substrate;

(b) an epitaxial layer formed on said substrate;

(c) a first oxide layer formed on said substrate, wherein said first oxide layer surrounds said epitaxial layer on top thereof;

(d) a second oxide layer formed on said epitaxial layer and said first oxide layer and is merged with said first oxide layer to form a contiguous inductor oxide layer;

(e) a metal line defining a planar inductor pattern formed on said second oxide layer above said epitaxial layer; and (f) an inter-metal dielectric layer encapsulating said metal line (g) wherein said epitaxial layer contains epitaxial silicon.

12. The planar silicon-based inductor according to claim 11 which is made by a process comprising the following steps:

(a) providing a silicon-based substrate as a starting wafer;

(b) forming a preliminary oxide layer on said substrate;

(c) forming a first oxide layer from said preliminary oxide layer which is disposed outside of and enclosing a predetermined epitaxial area;

(d) depositing an epitaxial layer in said epitaxial area, wherein said epitaxial layer has a resistivity substantially greater than that of said substrate;

(e) forming a second oxide layer covering both the epitaxial layer and the first oxide layer, wherein said second oxide layer is merged with said first oxide layer to thus form a contiguous inter-connected inductor oxide layer comprising said first oxide layer and said second oxide layer;

(f) forming a metal line according to the planar inductor pattern so as to form a silicon based inductor structure.

13. The planar silicon-based inductor according to claim 12 wherein said preliminary oxide layer is formed on said substrate during step (b) of claim 12 by oxidization or chemical vapor deposition.

14. The planar silicon-based inductor according to claim 12 wherein said preliminary oxide layer formed during step (b) of claim 12 has a thickness of about 2 µm.

15. The planar silicon-based inductor according to claim 12 wherein said planar inductor pattern is a spirally shaped pattern.

16. The planar silicon-based inductor according to claim 12 wherein said first oxide layer is formed from said preliminary oxide layer using a process comprising the following steps:

(a) forming a photoresist layer to cover said substrate;

(b) using a photographic technique to remove a portion of said photoresist corresponding to said epitaxial area;

(c) using an anisotropic etching technique to remove a portion of said preliminary oxide layer, which is formed during step (b) of claim 12, not covered by said photoresist; and (d) removing the remaining photoresist.

17. The planar silicon-based inductor according to claim 11 wherein said epitaxial layer contains arsenic or phosphorus doped epitaxial silicon.

18. The planar silicon-based inductor according to claim 11 wherein said epitaxial layer has a resistivity of at least 2,000 ohm-cm.

19. The planar silicon-based inductor according to claim 11 wherein said epitaxial layer is formed by depositing an epitaxial layer of N-type in said epitaxial area using intrinsic doping.

20. The planar silicon-based inductor according to claim 11 wherein said first oxide layer has a height greater than the height of said epitaxial layer so as to allow said second oxide layer to merge with said first oxide layer both vertically and horizontally.

* * * * *